US011372068B2

(12) United States Patent
Mandal et al.

(10) Patent No.: US 11,372,068 B2
(45) Date of Patent: *Jun. 28, 2022

(54) METHOD FOR METABOLITE SIGNAL QUANTITATION FOR MAGNETIC RESONANCE SPECTROSCOPY DATA

(71) Applicants: SECRETARY, DEPARTMENT OF ELECTRONICS AND INFORMATION TECHNOLOGY (DEITY), New Delhi (IN); National Brain Research Centre, Haryana (IN)

(72) Inventors: Pravat K. Mandal, Haryana (IN); Monika Grewal, Haryana (IN); Shammi More, Haryana (IN); Sumiti Saharan, Haryana (IN); Deepika Shukla, Haryana (IN)

(73) Assignees: Secretary, Department of Electronics and Information Technology (DEITY), New Delhi (IN); National Brain Research Centre, Haryana (IN)

( * ) Notice: Subject to any disclaimer, the term of this patent is extended or adjusted under 35 U.S.C. 154(b) by 47 days.

This patent is subject to a terminal disclaimer.

(21) Appl. No.: 16/071,068

(22) PCT Filed: Aug. 19, 2016

(86) PCT No.: PCT/IB2016/054978
§ 371 (c)(1),
(2) Date: Jul. 18, 2018

(87) PCT Pub. No.: WO2017/125800
PCT Pub. Date: Jul. 27, 2017

(65) Prior Publication Data
US 2021/0190891 A1  Jun. 24, 2021

(30) Foreign Application Priority Data
Jan. 19, 2016  (IN) .............................. 201611001944

(51) Int. Cl.
*G01R 33/485* (2006.01)
*G01R 33/46* (2006.01)
*G01R 33/56* (2006.01)

(52) U.S. Cl.
CPC ....... *G01R 33/485* (2013.01); *G01R 33/4625* (2013.01); *G01R 33/5608* (2013.01)

(58) Field of Classification Search
USPC ...................................................... 324/309
See application file for complete search history.

(56) References Cited

U.S. PATENT DOCUMENTS

| 7,966,053 B2* | 6/2011 | Balchandani ........ G01R 33/485 600/410 |
| 9,234,953 B2* | 1/2016 | Labadie ............. G01R 33/4818 |

(Continued)

*Primary Examiner* — Rodney E Fuller
(74) *Attorney, Agent, or Firm* — Knobbe Martens Olson & Bear LLP

(57) ABSTRACT

It is an integrative platform for visualization, preprocessing and quantitation of MRS data acquired using single voxel, multi voxel magnetic resonance spectroscopy imaging (MRSI) and MEshcher-GArwood Point-RESolved Spectroscopy (MEGA-PRESS) acquisition methods. The method integrates both time- and frequency-domain signal processing methods on a single platform. The method is optimized for proton ($^1$H) and phosphorous ($^{31}$P) MRS data. It employs the use of iterative baseline estimation and fitting procedure to provide improved quantitation accuracy. The method can be used in both interactive and automatic mode to cater to the needs of researchers and clinicians.

7 Claims, 2 Drawing Sheets

(56) References Cited

U.S. PATENT DOCUMENTS

| | | |
|---|---|---|
| 2008/0272782 A1 | 11/2008 | Lin |
| 2009/0091322 A1* | 4/2009 | Posse ................ G01R 33/5611 324/307 |
| 2014/0085304 A1 | 3/2014 | Kim et al. |
| 2014/0191755 A1* | 7/2014 | Bauer ................ G01R 33/4625 324/318 |

* cited by examiner

| | Packages | Input Data Types | | | | Processing Mode | | | Post-processing | |
|---|---|---|---|---|---|---|---|---|---|---|
| | | SV | MV | MRSI | Other | Interactive | Automatic | Batch | Absolute Quantitation | Correction Factors |
| $^1H$ | GANNET | | | | ✓ᵇ | | | ✓ | ✓ | ✓··· |
| | ProFIT | | | | ✓ᵃ | ✓ | | | | |
| | LC Model | ✓ | ✓ | | ✓ᵇ | | ✓ | ✓ | ✓ | |
| | MIDAS | ✓ | ✓ | ✓ | | ✓ | ✓ | ✓ | ✓ | ✓ |
| | AQSES GUI | ✓ | ✓ | | | ✓ | | | | |
| $^1H, ^{31}P$ | jSIPRO | | | ✓ | | ✓ | | ✓ | ✓ | ✓ |
| | SIVIC | | | ✓ | | ✓ | | | | |
| | jMRUI | ✓ | ✓ | ✓ | | ✓ | ✓ | ✓ | ✓ | |
| | SPID | ✓ | ✓ | ✓ | | ✓ | | ✓·· | | |
| | TARQUIN | ✓ | ✓ | ✓ | ✓ᵇ | ✓ | ✓ | ✓ | ✓ | |
| | KALPANA | ✓ | ✓ | ✓ | ✓ᵇ | ✓ | ✓ | ✓ | ✓ | ✓ |

FIGURE 2

METHOD FOR METABOLITE SIGNAL QUANTITATION FOR MAGNETIC RESONANCE SPECTROSCOPY DATA

TECHNICAL FIELD

The present invention relates to signal processing and quantitation in Magnetic Resonance Spectroscopy. Particularly, the invention provides a comprehensive method that offers both automated and interactive signal processing and affords increased accuracy in signal quantitation.

BACKGROUND

Magnetic resonance spectroscopy (MRS) is an important non-invasive technique for in vivo detection of a wide range of brain neurochemicals. MRS technique has been commonly used for diagnostic purposes, and the utility of MRS is extended to diagnosing chronic and severe low back pain, as disclosed in one of the prior art patents.

The effectiveness of MRS technique is based on the ability to quantify characteristic metabolite spectra, which has various limitations such as small signal to noise ratio, overlapping spectra, distorted baseline due to physical reasons and engineering related concerns, not limited thereto.

Studies have been conducted and have indicated that the choice of quantification methods may affect the interpretation of results and their statistical significance. As such, different processing algorithms may be suitable for processing different MR data types. Indeed, it is preferable to analyze each spectrum separately using two or more quantification methods in time and frequency domain, to establish the robustness and consistency of observations. Therefore, a comprehensive MRS quantitation method with a provision of choosing different quantitation algorithms in time and frequency-domain as well as in-built features like segmentation and quantitation is much needed in MRS data processing.

A variety of data processing packages are available that attempt to address specific limitations and are optimized for either proton ($^{1}$H) or phosphorous ($^{31}$P) MRS and Incorporate a specific baseline estimation method and peak fitting method. For instance, various models like LCModel and AQSES are designed specifically for $^{1}$H MRS data; MIDAS, JSIPRO, SIVIC are optimized specifically for multi-voxel magnetic resonance spectroscopy imaging (MRSI) data; GANNET is designed for batch analysis of GABA edited spectra, and proFIT is designed for J-resolved spectra only.

OBJECTIVES OF INVENTION in order for realizing the research and clinical potential of MRS technique, a comprehensive MRS quantitation tool is required that offers various features such as customization to both clinical and research use, capacity to be optimized for multiple MR detectable nuclei e.g. $^{1}$H, $^{31}$P. It is capable of Implementing all MRS preprocessing, quantitation, and post-processing techniques in single platform thereby reducing dependencies on multiple software, and implements robust and reliable quantitation method.

While existing packages cater to some of these requirements, none are designed to provide a complete solution. Certain vendor specific packages are intended for clinical use and offer close to complete automation features with accessible visualization of results, but often restrict user customization of the processing workflows preventing optimization of parameters for particular metabolites. In contrast, certain tools developed for research laboratories aim for processing control and flexibility, but do not focus as much on data visualization, automation, and post processing features such as segmentation.

Further, most of the currently available MRS signal processing packages implement a single quantitation algorithm that relies on a given set of underlying assumptions regarding the nature of the baseline and the treatment of signals from macromolecules. As such, they have been individually designed to be used for a specific data types and restrict the user to either time- or frequency-domain analysis.

The principal object of this invention is to offer a comprehensive solution that meets all the aforementioned feature requirements. One key object of the invention is to provide an interface that enables both automatic signal processing and quantitation of metabolites for clinical use as well as customizable modules that enable processing parameters to be dynamically varied to achieve the optimal post-processed results for research setting.

Another object of the invention is that the method provides segmentation and absolute quantitation interface along with signal processing.

Yet another object of the invention is to enhance the accuracy of spectral fitting by use of an iterative baseline estimation and peak fitting method to attempt to minimize the residual error of the signal fit. The method offers the option of utilization of this iterative algorithm with various non-parametric baseline estimation and peak fitting methods.

A final object of the invention is that it can be utilized for both proton ($^{1}$H) and phosphorous ($^{31}$P) MRS data.

SUMMARY

The present invention relates to a comprehensive method for versatile processing and improved quantitation accuracy of magnetic resonance spectra using an Iterative baseline estimation and fitting procedure that can be implemented with a variety of baseline estimation and peak fitting methods. It is an integrative MATLAB-based platform for visualization, preprocessing and quantitation of MRS data acquired using single voxel and MRSI and special type (e.g., MEGA-PRESS) acquisition methods. The method integrates both time- and frequency-domain signal processing methods on a single platform and implements non-parametric modeling of baseline through a variety of available methods. Apart from providing a comprehensive and flexible signal processing Interface, the novelty lies in its approach to signal quantitation.

According to an embodiment of the present invention, a method for interactive and automatic processing of signals in MRS is disclosed. The method comprises providing metabolite and image data Input to a magnetic resonance spectroscopy system, segregating a set of voxels containing data having a minimum signal-to-noise ratio based on given input. Further, the spectral parameters are pre-processed from the remaining voxels. The individual spectral peak area from each voxel is converted into metabolite concentration and a metabolite concentration map registered with a magnetic resonance image is obtained as output.

According to another embodiment of the invention, metabolite and image data input includes MRS imaging data, reference MRS imaging data, and MRI Image.

According to another embodiment of the invention, the method is optimized for both proton ($^{1}$H) and phosphorous ($^{31}$P) MRS data.

According to another embodiment of the invention, the MRS imaging data is from SV, MRSI, and MEGA-PRESS acquisition.

According to another embodiment of the invention, the reference MRS imaging data is unsuppressed water, an internal peak, or in-vitro phantom signal.

According to still another embodiment of the invention, the step of pre-processing from the remaining voxels comprises correcting for phase and frequency relating to reference MRS imaging data. Subsequently, water suppression is applied with Hankel Singular Value Decomposition (HSVD). In order to improve the spectral resolution, zero-filling is done and a filtered signal is obtained by temporal apodization method.

According to another embodiment of the invention, the metabolite concentration map is corrected for partial volume effect at each voxel and displayed.

According to still another embodiment of the invention, an iterative approach for baseline correction and peak fitting is used.

According to yet another embodiment of the invention, absolute quantitation of metabolite concentration and segmentation of MRI image is done.

BRIEF DESCRIPTION OF DRAWINGS

The detailed description is described with reference to the accompanying figures. In the figures, the left-most digit(s) of a reference number identifies the figure in which the reference number first appears. The same numbers are used throughout the drawings to reference like features and components.

FIG. 2 is a table depicting comparison of features the main user interface of prior art and the method provided by the present invention.

DETAILED DESCRIPTION

Figure 1:
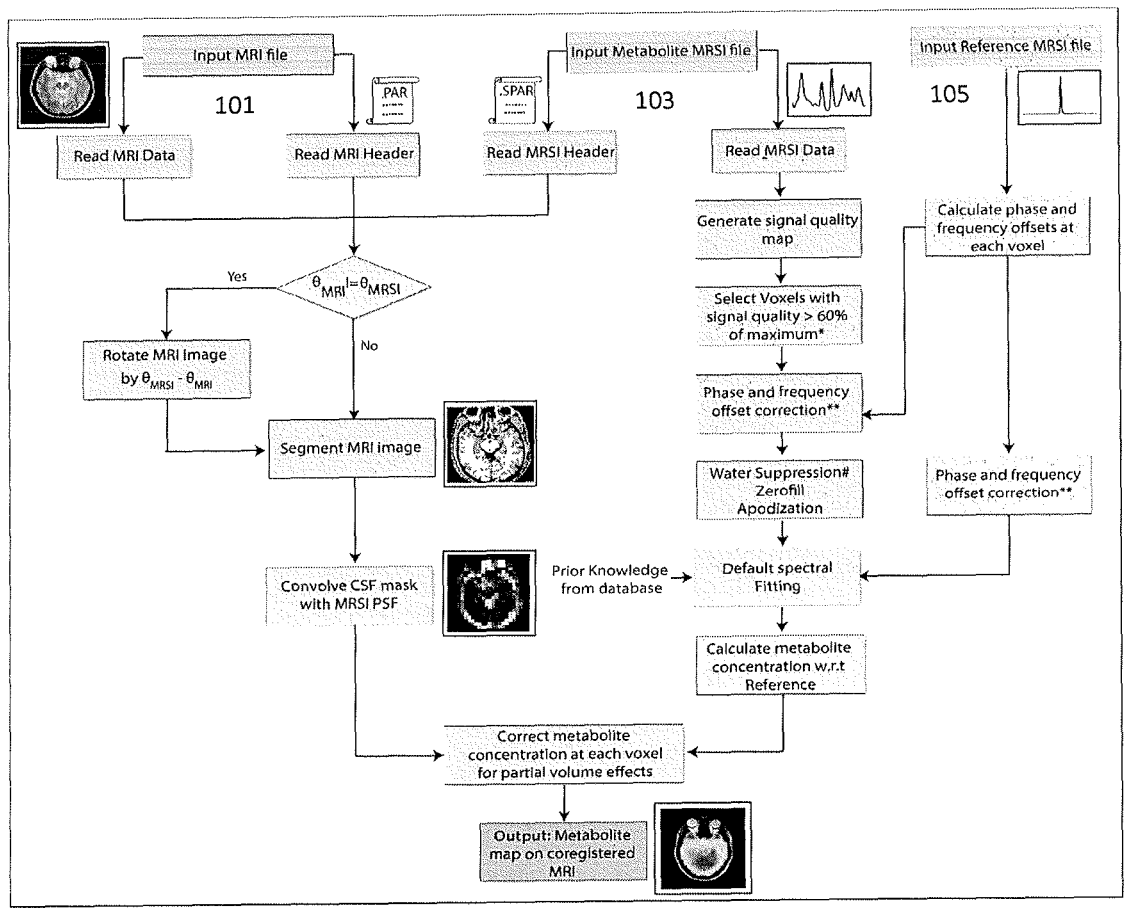
FIG. 1 illustrates a flow diagram of default processing pipeline for metabolite map generation for MRSI data.

The following discussion provides a brief, general description of a suitable environment in which various embodiments of the present disclosure can be implemented. The aspects and embodiments are described in the general context of computer executable mechanisms such as routines executed by a device. The embodiments described herein can be practiced with other system configurations, including Internet appliances, hand held devices, multi-processor systems, microprocessor based or programmable consumer electronics, network PCs, mini computers, mainframe computers and the like. The embodiments can be embodied in a special purpose computer or data processor that is specifically programmed configured or constructed to perform one or more of the computer executable mechanisms explained in detail below.

Exemplary embodiments now will be described with reference to the accompanying drawings. The disclosure may, however, be embodied in many different forms and should not be construed as limited to the embodiments set forth herein; rather, these embodiments are provided so that this disclosure will be thorough and complete, and will fully convey its scope to those skilled in the art. The terminology used in the detailed description of the particular exemplary embodiments illustrated in the accompanying drawings is not Intended to be limiting. In the drawings, like numbers refer to like elements.

The specification may refer to "an", "one" or "some" embodiment(s) in several locations. This does not necessarily imply that each such reference is to the same embodiment(s), or that the feature only applies to a single embodiment. Single features of different embodiments may also be combined to provide other embodiments.

As used herein, the singular forms "a", "an" and "the" are intended to include the plural forms as well, unless expressly stated otherwise. It will be further understood that the terms "includes", "comprises", "including" and/or "comprising" when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" Includes any and all combinations and arrangements of one or more of the associated listed items.

Unless otherwise defined, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The figures depict a simplified structure only showing some elements and functional entities, all being logical units whose implementation may differ from what is shown. The connections shown are logical connections; the actual physical connections may be different. It is apparent to a person skilled in the art that the structure may also comprise other functions and structures. It should be appreciated that the functions, structures, elements and the protocols used in communication are irrelevant to the present disclosure. Therefore, they need not be discussed in further detail here.

In addition, all logical units described and depicted in the figures include the software and/or hardware components required for the unit to function. Further, each unit may comprise within itself one or more components, which are implicitly understood. These components may be operatively coupled to each other and be configured to communicate with each other to perform the function of the said unit.

The present invention is directed to an integrative platform for visualization, preprocessing and quantitation of MRS data acquired using single voxel and multi-voxel MRSI and MEGA-PRESS acquisition methods. The method is MATLAB-based, integrates both time-domain and frequency-domain signal processing methods on a single platform and implements non-parametric modeling of baseline through a variety of known techniques. Apart from providing a unique comprehensive and flexible signal processing interface, novelty of the method lies in its approach to signal quantitation.

Signal quantitation through various time-domain and frequency-domain methods has been achieved through application of an iterative baseline extraction and peak fitting method which allows for maximum accuracy and reliability of signal quantitation. The following terms have been used in abbreviated form in the subsequent paragraphs, SV:

Single voxel; MV: Multi voxel i.e. multiple spectra; MRSI: Magnetic Resonance Spectroscopic Imaging; MRI: Magnetic Resonance Imaging; MRS: Magnetic Resonance Spectroscopy; MEGA-PRESS: MEshcher-GArwood Point-RE-Solved Spectroscopy; PSF: Point Spread Function; CSF: Cerebero-spinal fluid; LCModel: Linear combination model; AQSES: automatic quantitation of short echo time spectra; MIDAS: Metabolite Imaging and Data Analysis System; JSIPRO: Java Spectroscopic imaging Processing; SIVIC: Spectroscopic Imaging, Visualization, and Computing; GANNET: GABA-MRS Analysis Tool; proFit: Prior-Knowledge Fitting; TDFD: time-domain frequency-domain; FD: Frequency Domain; TD: Time Domain; NLLS: Nonlinear least square; SSA: Singular Spectrum Analysis; JMRUI: Java-based graphical user interface for the Magnetic Resonance User interface; TARQUIN: Totally Automatic Robust Quantitation in NMR; 3DICSI: 3D Interactive Chemical Shift Imaging; HSVD: Hankel Singular Value Decomposition; VARPRO: Variable Projection.

This invention is useful in both clinical and research settings. Specifically, in vivo MRS is beneficial for non-invasive acquisition of biochemical information of various tissues in the human body related to many diseases such as cancer, epilepsy, and Parkinson's disease and as such this invention has tremendous applicative value.

The invention provides following key features over the prior art. The method is optimized for a wide variety of data that includes SV, MRSI and edited spectra such as MEGA-PRESS in contrast to most of the existing packages, which are optimized for particular type of data, for instance, LCModel and AQSES are designed specifically for $^1$H MRS data; MIDAS, JSIPRO, SIVIC are optimized specifically for MRSI data; GANNET is designed for batch analysis of GABA edited spectra, and proFIT is designed for J-resolved spectra only. It also provides a variety of peak fitting methods under one integrated platform. The user has an advantage of spectral fitting In time-domain, frequency-domain, or mixed domain.

Further, the method provided by the present invention implements an iterative baseline estimation and peak fitting algorithm with all methods leading to better quantitation accuracy. In prior art, this algorithm has only been implemented for TDFD fitting in combination with baseline estimation using wavelet shrinkage method and has been shown to yield more accurate results as compared to conventional method of modelling baseline and metabolite signal together to form non-linear least square (NLLS) cost function. However, the present method extends and improves upon this invention by implementing iterative estimation procedure with VARPRO, time-domain NLLS, and FDpeak fitting methods, and in combination with various baseline estimation methods, i.e. Singular Spectrum Analysis (SSA), spline, and wavelet decomposition.

The invention also provides various post-processing features such as absolute quantitation, segmentation, and metabolite map generation, where several existing packages lack e.g. JMRUI, LCModel, TARQUIN, 3DICSI, AQSES.

FIG. 1 illustrates a flow diagram of default processing pipeline for metabolite map generation for MRSI data. This pipeline requires the MRSI data 103, the reference MRSI data 105, and MRI images as input files 101. Water is usually used for reference MRSI data. In brief, the steps executed in the processing pipeline are as follows: The metabolite MRSI data are assessed for quality and voxels containing data with low signal-to-noise ratio (SNR), are rejected. The spectra from remaining voxels are then preprocessed as follows: phase and frequency correction with respect to reference input, water suppression with Hankel Singular Value Decomposition (HSVD) method, zero-filling to twice the spectral length, and a filtered signal is obtained by applying temporal apodization by use of a 4-Hz Gaussian filter. The individual spectral peak areas are then quantified using SSA as baseline estimation method and time-domain peak fitting.

The peak area values from all voxels are then converted to metabolite concentrations using water or a similar metabolite as an internal reference. In order to correct for partial volume effects, MRI image is segmented and percent cerebrospinal fluid (CSF) is calculated within each MRSI voxel by convolving CSF mask image with MRSI point spread function. Subsequently, metabolite concentration map Is corrected for partial volume effects at each voxel and displayed as an overlay onto anatomical MRI images. The final output of the pipeline is metabolite concentration map co-registered with the MRI image as well as a tabulated listing of voxel-wise metabolite concentrations in institutional units along with estimated spectral parameter values.

Abbreviations used in FIG. 1 are MRI: Magnetic Resonance Imaging; MRSI: Magnetic Resonance Spectroscopy Imaging; PSF: Point spread function; CSF: Cerebrospinal fluid FIG. 2 illustrates table 1 depicting comparison of features of the main user interface of prior art and the present invention. The criteria of differentiating the package discloses here are: Input data types which Includes SV, MV, MRSI or other types (e.g., MEGA-PRESS); processing mode of user interface which may be Interactive, automatic and batch type and post-processing methods provided (absolute quantitation and correction factors for absolute quantitation).

Following references have been used: [a] 2D JPRESS; [b] MEGA-PRESS;  Command line; * Segmentation only.

Advantages

The present Invention provides an intuitive user interface that enables three different approaches for MRS data processing. Primarily, it permits the expert users to specify processing parameters at each stage and test the performance of different quantitation algorithms on their data in order to choose the best suited processing pipeline. Second for non-expert users, it provides customizable processing modules optimized separately for SV, MRSI, and MEGA-PRESS that allow complete quantitation with just a few clicks. Third, a batch processing interface is provided for automated analysis of large datasets without user interaction. The batch processing interface lets the user load and customize any default processing pipeline or define a new processing pipeline and run it for bulk data.

This invention ensures reliable and robust spectral quantitation by using an Iterative baseline estimation and peak fitting approach, whereby the process of baseline estimation and parametric peak fitting is alternated until the improvement in fitting residual in consecutive iterations is lower than a pre-defined threshold level. Further, it offers the option of utilization of this iterative process with various baseline estimation methods along with commonly used peak fitting methods in time- and frequency-domain. The robustness and accuracy of the invention in metabolite quantitation is well-matched to the established packages for MRS quantitation i.e. LCModel and JMRUI.

The abovementioned description of the embodiments of the invention has been presented for the purposes of illustration and description. It is not Intended to be exhaustive or to limit the invention to the precise form disclosed. Many modifications and variations are possible in light of the above teaching. It is Intended that the scope of the invention be limited not by this detailed description, but rather by the claims appended hereto.

As will be appreciated by one skilled in the art, the present invention may be embodied as a method, system, or computer program product. Accordingly, the present invention may take the form of an entirely hardware embodiment, a software embodiment or an embodiment combining software and hardware aspects all generally referred to herein as a "circuit" or "module." Furthermore, the present invention may take the form of a computer program product on a computer-usable storage medium having computer-usable program code embodied in the medium.

It will be understood that each block of the flowchart illustrations and/or block diagrams, and combinations of blocks in the flowchart illustrations and/or block diagrams, can be implemented by computer program instructions. These computer program Instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

Instructions may also be loaded onto a computer or other programmable data processing apparatus like a scanner/check scanner to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

In the drawings and specification, there have been disclosed exemplary embodiments of the invention. Although specific terms are employed, they are used in a generic and descriptive sense only and not for purposes of limitation, the scope of the invention being defined by the following claims.

We claim:

1. A method for interactive and automated processing of signals in magnetic resonance spectroscopy (MRS) comprising:

providing metabolite and image data input to a magnetic resonance spectroscopy system;

segregating a set of voxels containing data having a minimum signal-to-noise ratio based on given input;

pre-processing spectral parameters from the remaining voxels;

establishing individual spectral peak area from each voxel for conversion into metabolite concentration, wherein an iterative approach is used for baseline correction and peak fitting of the individual spectral peak area;

generating a metabolite concentration map along with a magnetic resonance image as output, wherein the metabolite concentration map is corrected for partial volume effect at each voxel.

2. The method as claimed in claim 1, wherein the metabolite and image data input includes MRS imaging data, reference MRS imaging data, and MRI image.

3. The method as claimed in claim 2, wherein the MRS imaging data input is single voxel (SV) data and multi-voxel (MV) data from magnetic resonance spectroscopy imaging (MRSI), wherein a MEshcher-GArwood Point RESolved Spectroscopy (MEGA-PRESS) acquisition technique is used to identify a particular metabolite from the MRS imaging data.

4. The method as claimed in claim 2, wherein the reference MRS imaging data input is at least one of unsuppressed water, an internal peak, or in vitro MRS signal from a phantom.

5. The method as claimed in claim 1, wherein the method is optimized for both proton ($^1$H) and phosphorous ($^{31}$P) MRS data.

6. The method as claimed in claim 1, wherein the step of pre-processing spectral parameters from the remaining voxels comprises the steps of:

a. correcting phase and frequency with respect to reference MRS imaging data;

b. applying water suppression with Hankel Singular Value Decomposition (HSVD);

c. zero- filling to improve the spectral resolution; and d. obtaining a filtered signal by temporal apodization method.

7. The method as claimed in claim 1, wherein absolute quantitation of metabolite concentration and segmentation of MRI image is done.

* * * * *